United States Patent
Yamashita et al.

(10) Patent No.: US 6,855,637 B2
(45) Date of Patent: Feb. 15, 2005

(54) METHOD FOR MANUFACTURING SURFACE ACOUSTIC WAVE DEVICE

(75) Inventors: Kiyoharu Yamashita, Neyagawa (JP); Kazuo Ikeda, Hirakata (JP); Shunichi Seki, Amagasaki (JP); Mitsuhiro Furukawa, Kobe (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/478,479

(22) PCT Filed: Jul. 1, 2002

(86) PCT No.: PCT/JP02/06550

§ 371 (c)(1),
(2), (4) Date: Nov. 21, 2003

(87) PCT Pub. No.: WO03/005577

PCT Pub. Date: Jan. 16, 2003

(65) Prior Publication Data

US 2004/0157438 A1 Aug. 12, 2004

(30) Foreign Application Priority Data

Jul. 2, 2001 (JP) ........................................ 2001-200572
Jul. 23, 2001 (JP) ........................................ 2001-221101

(51) Int. Cl.⁷ ...................... H01L 21/302; H01L 21/461
(52) U.S. Cl. ........................................ 438/706; 438/745
(58) Field of Search ........................... 438/706, 31, 32, 438/33, 106, 712, 739, 708, 792, 745

(56) References Cited

U.S. PATENT DOCUMENTS

| | | | | |
|---|---|---|---|---|
| 5,283,037 A | * | 2/1994 | Baer et al. ................ | 422/82.01 |
| 5,668,057 A | * | 9/1997 | Eda et al. .................... | 438/113 |
| 5,835,990 A | * | 11/1998 | Saw et al. .............. | 310/313 D |

FOREIGN PATENT DOCUMENTS

| | | |
|---|---|---|
| GB | 2 350 000 A | 11/2000 |
| JP | 4-21205 | 1/1992 |
| JP | 4-288718 | 10/1992 |
| JP | 8-162878 | 6/1996 |
| JP | 10-93369 | 4/1998 |
| JP | 10-107572 | 4/1998 |
| WO | WO99/05788 | 2/1999 |

* cited by examiner

Primary Examiner—David Nhu
(74) Attorney, Agent, or Firm—Parkhurst & Wendel, L.L.P.

(57) ABSTRACT

Provided is a method of manufacturing surface acoustic wave (SAW) devices having a first conductive pattern and a second conductive pattern of different thicknesses on one piezoelectric substrate. Combination of a plurality of steps of forming metal films and etching steps allows accurate production of SAW devices having a plurality of electrodes of different thicknesses on one piezoelectric substrate.

28 Claims, 3 Drawing Sheets

METHOD FOR MANUFACTURING SURFACE ACOUSTIC WAVE DEVICE

TECHNICAL FIELD

The present invention relates to a method of manufacturing a surface acoustic wave (SAW) device.

BACKGROUND ART

A conventionally used method of forming independent SAW devices accommodating to a plurality of frequencies on one substrate is making a plurality of electrode patterns having the same thickness at different intervals. When a plurality of SAW devices having significantly different frequencies are formed by this method, it is extremely difficult to design and manufacture a plurality of patterns having different intervals between the electrodes under optimum conditions of each pattern.

As means of addressing this problem, the Japanese Patent Unexamined Publication No. H10-93369 discloses a method of laminating a plurality of kinds of metals having significantly different etching speeds, and forming a plurality of SAW devices having different thicknesses by utilizing the difference in etching speeds.

However, for the method of utilizing the difference in etching speeds, combinations of metals having large difference in etching speeds are limited and thus the design of electrode patterns is restricted. Additionally, when a metal film is dry-etched, a part of the metal film without a photo-resist layer is susceptible to damage. On the other hand, when a metal film is wet-etched, the side faces of the metal film are affected by the etching. Therefore, by any one of the etching methods, accurate formation of electrode patterns is difficult. For this reason, variations in frequency increase.

DISCLOSURE OF THE INVENTION

A first metal film is formed on a piezoelectric substrate. By etching the first metal film, a bottom part of a first conductive pattern is formed. A second metal film is formed on the side of the piezoelectric substrate having the bottom part of the first conductive pattern. Further, a third metal film is formed on the second metal film. By etching these first metal film, second metal film, and third metal film, the first conductive pattern and a second conductive pattern are formed. This method reduces deviation from a target frequency and variations in frequency in a plurality of SAW devices that have metal films of different thicknesses on one piezoelectric substrate and accommodate to different frequencies.

DETAILED DESCRIPTION OF PREFERRED EMBODIMENTS

First Exemplary Embodiment

A manufacturing method of a first exemplary embodiment is described with reference to FIGS. 1A through 1F.

Figure 1A:
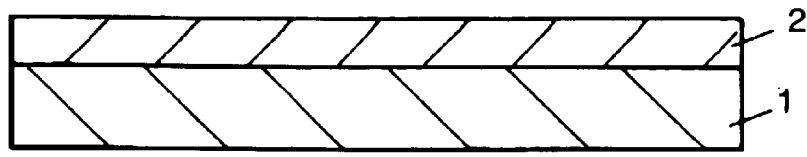
FIGS. 1A through 1F are sectional views of a surface acoustic wave (SAW) filter in accordance with a first exemplary embodiment of the present invention, showing a manufacturing process thereof.

As shown in FIG. 1A, first metal film 2, e.g. a 250-nm-thick Cu-containing Al layer, is formed on piezoelectric substrate 1 made of $LiTaO_3$ or other material, by sputtering.

Figure 1B:
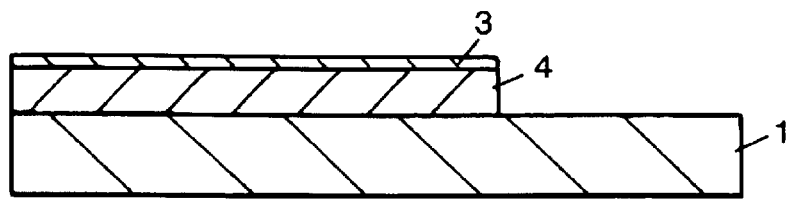

Next, photo-resist layer 3 is applied to first metal film 2. After a desired pattern is exposed to light and developed by photo-lithography, bottom part 4 of a first conductive pattern is formed by wet etching, as shown in FIG. 1B. Now, bottom part 4 of the first conductive pattern refers to an area of the first metal film existing before the final shape of the first conductive pattern is formed.

Figure 1C:
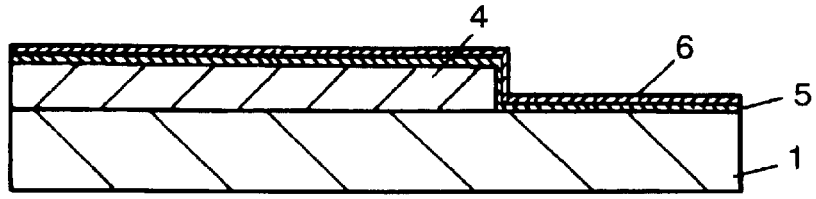

Next, after photo-resist layer 3 is peeled off, second metal film 5, e.g. a 10-nm-thick Ti-containing layer, is formed on the side of piezoelectric substrate 1 having bottom part 4 of the first conductive pattern formed thereon by sputtering, as shown in FIG. 1C. On the second metal film, third metal film 6, e.g. an 80-nm-thick Al-containing layer, is formed by sputtering.

Figure 1D:
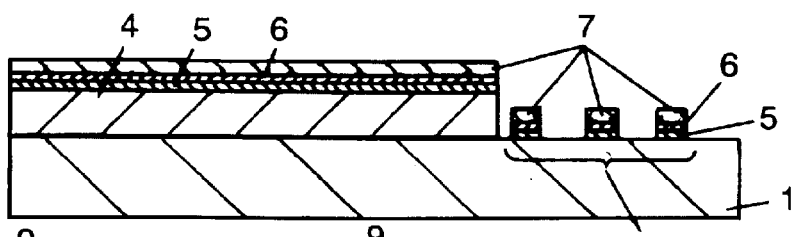

Next, photo-resist layer 7 is applied to third metal film 6. After a desired pattern is exposed to light and developed by photo-lithography, second conductive pattern 8 is formed by dry etching, as shown in FIG. 1D. Then, the photo-resist layer is peel off to provide high-frequency surface acoustic wave (SAW) filter 11 made of second conductive pattern 8 first.

Figure 1E:
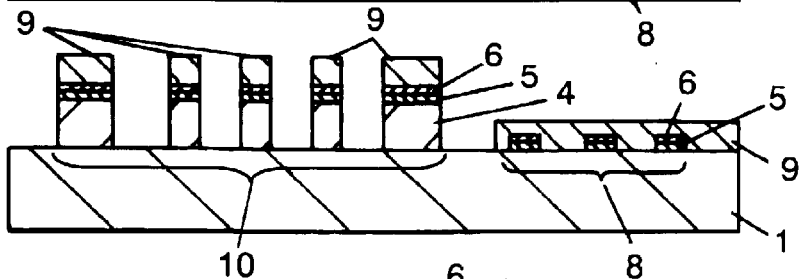

Next, photo-resist layer 9 is applied to the entire surface. While the second conductive pattern is protected, a desired pattern is exposed to light and developed-by photo-lithography. Then, as shown in FIG. 1E, first conductive pattern 10 is formed by dry etching.

Figure 1F:
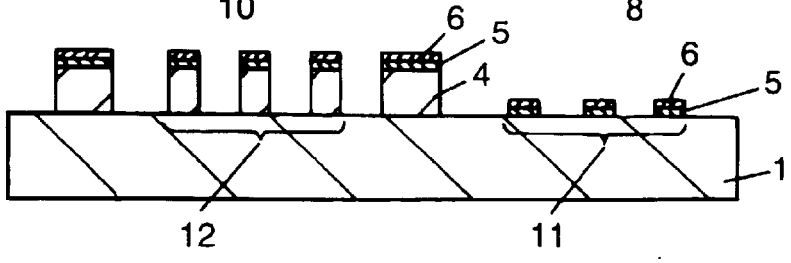

Next, photo-resist layer 9 is peeled off to provide low-frequency SAW filter 12 made of first conductive pattern 10 as shown in FIG. 1F, after the second conductive pattern.

In this manner, two kinds of SAW devices that have metal films of different thicknesses on one piezoelectric substrate 1 are formed so that thinner second conductive pattern 8 is formed first, and thicker first conductive pattern 10 is formed next. Thus, metal films having different thicknesses are formed on one piezoelectric substrate by combination of formation of a plurality of metal films and etching. This method can reduce deviation from a target frequency and variations in frequency in a plurality of SAW devices accommodating to different frequencies. Thereafter, cutting the patterns into a predetermined dimension divides the patterns into pieces of SAW devices.

In this embodiment, the thickness ratio of first conductive pattern 10 with respect to second conductive pattern 8 is approx. 3.8. When a plurality of conductive patterns having different thicknesses are formed on one piezoelectric substrate 1, formation of conductive patterns having large difference in thickness at the same time is prone to decrease accuracy of conductive patterns. Especially when the thickness ratio of conductive patterns exceeds 2.0, the accuracy of the conductive patterns decreases. However, in this embodiment, the conductive patterns are formed independently. This method increases the accuracy of conductive patterns.

In this embodiment, the center frequency of low-frequency SAW filter 12 is 900 MHz and that of high-frequency SAW filter 11 is 1.4 GHz. Now, first conductive pattern 10 and second conductive pattern 8 include comb-shaped electrodes, reflector electrodes, lead electrodes, and pad electrodes for forming low-frequency SAW filter 12 and high-frequency SAW filter 11, respectively.

The present invention is devised by aiming at the following two points. To reduce deviation from a target frequency and variations in frequency, variations in the thickness of the conductive patterns and damages thereto should be reduced. These influences are larger at a higher target frequency.

The optimum conditions for etching a metal film varies with the thickness of the metal film. For this reason, when a thicker metal film and a thinner metal film are etched at the same time, the etching conditions of either of the metal films are out of the optimum conditions thereof. Thus, the accuracy of the film thickness decreases. To avoid the decrease in accuracy, second conductive pattern 8 for high-frequency having thinner metal films is formed first. Etching under the conditions suitable for the thinner films reduces damages to piezoelectric substrate 1. Additionally, first conductive pattern 10 is formed after second conductive pattern 8 is protected using photo-resist layer 9. This step can reduce damages to the film thickness of second conductive pattern 8 and piezoelectric substrate 1. These reduce deviation from a target frequency and variations in frequency in SAW devices.

Next etching step is performed after second conductive pattern 8 is protected by a photo-resist layer. These steps prevent deviation from a target frequency and variations in frequency in thinner second conductive pattern 8 from significantly increasing.

Additionally, in the step of forming the metal films, sputtering is used. This process allows formation of a homogeneous metal film having excellent orientation and few variations in thickness, thus reducing deviation from a target frequency and variations in frequency.

Further, in the step of etching first metal film 2, wet etching is used. This process can efficiently etch a thick metal film for a short period of time. This causes almost no damages to piezoelectric substrate 1. Because only first metal film 2 is formed on the substrate, no damages are caused to second metal film 5 and third metal film 6.

In the step of etching second metal film 5 and third metal film 6, dry etching is used. This process forms second conductive pattern 8 at high accuracy, thus reducing deviation from a target frequency and variations in frequency in high-frequency SAW filter 11.

Additionally, for second metal film 5, a material different from those of first metal film 2 and third metal film 6 is used. This improves orientation of respective metal films and adhesive property therebetween. Thus, adhesive property between first conductive pattern 10 and second conductive pattern 8 and electric strength thereof are improved.

In this embodiment, $LiTaO_3$ is used for piezoelectric substrate 1. However, any piezoelectric material can be used.

In this embodiment, wet etching is used as the etching method for forming bottom part 4 of first conductive pattern 10. In reducing a loss in a SAW device, wet etching is effective. In reducing deviation from a target frequency and controlling variations in frequency, dry etching is effective. For these reasons, it is desirable to select either one according to the purpose.

Additionally, it is desirable to form a protective layer, e.g. a 30-nm-thick $Al_2O_3$-containing layer, on first conductive pattern 10 and second conductive pattern 8 by an anodizing process. This protective layer prevents deterioration of the property and short circuits even when electrically conductive foreign substances adhere to first conductive pattern 10 or second conductive pattern 8. This layer also inhibits corrosion and alteration of metal films even when moisture or gas enters into the patterns. Therefore, initial failure is reduced, and reliability, such as weathering performance, is improved.

Materials of the protective layer include $SiO_2$, Si, and silicon nitride in addition to $Al_2O_3$. The protective layer can be provided on the entire surface of first conductive pattern 10 and second conductive pattern 2, the entire surface or a part thereof except pad electrodes for external connection, or the entire surface or a part thereof on piezoelectric substrate 1. However, to reduce a loss in a SAW device, it is desirable provide no protective layer on piezoelectric substrate 1.

In this embodiment, Cu-containing Al is used as the material of first metal film 2. However, Al alloys containing metals other than Cu, e.g. Al—Ti, Al—W, and Al—Ta, can also be used. Ti (Titanium) is used as the material of second metal film 5. However, metals and alloys that improve adhesive property between a plurality of kinds of metals laminated on each other can be used. Such metals and alloys include Ti alloys, Cr and Cr alloys, Ta and Ta alloys, W and W alloys, Ni and Ni alloys, Mo and Mo alloys, and Mg and Mg alloys. Al (Aluminum) is used as the material of third metal film 6. In addition to Al, Al alloys, e.g. Al—Ti, Al—W, and Al—Ta, can also be used.

The material of first metal film 2 and the material of third metal film 6 can be the same or different from each other.

As for piezoelectric substrate 1 having first metal film 2 formed thereon, it is desirable to measure the thickness of first metal film 2, using a fluorescent X-ray analyzer, for example, and give feedback on any deviation from a target value to sputtering conditions for correction.

Further, the thickness of the portion having only second metal film 5 and third metal film 6 on piezoelectric substrate 1 is measured, using a fluorescent X-ray analyzer, for example, in a state with bottom part 4 of the first conductive pattern, second metal film 5, and third metal film 6 formed. Then, the measurement of the total thickness of second metal film 5 and third metal film 6 are separated to obtain the thickness of second metal film 5 and the thickness of third metal film 6 according to the wavelengths of the fluorescent X-rays. When any deviation from a target value is found, feedback is given to the sputtering conditions for correction.

The measurement of the thicknesses of the films on piezoelectric substrate 1 is performed in the center of piezoelectric substrate 1. This enables to control the thickness of metal films, ensuring productivity, without reducing the number of SAW devices on piezoelectric substrate 1. As the area in which the film thickness is measured on piezoelectric substrate 1, it is desirable to ensure an area in which a uniform thickness is ensured with little influence of steps in the vicinity of the area. It is also desirable to provide a plurality of points of measurement. This allows measurement of distribution of the thickness of metal films on piezoelectric substrate 1. Thus, the thickness of metal films is accurately controlled in the direction of the surface of piezoelectric substrate 1.

Even when only second metal film 5 is formed on bottom part 4 of first conductive pattern, the thickness of second metal film 5 can be obtained by performing fluorescent X-lay analysis of the portion having only second metal film 5 on piezoelectric substrate 1.

When the area having second metal film 5 and third metal film 6 formed on piezoelectric substrate 1 is small, influence of other metals, e.g. bottom part 4 of first conductive pattern, deteriorates measurement accuracy in fluorescent X-ray analysis in some cases. In such a case, the second metal film and the third metal film are formed another piezoelectric substrate by sputtering under the same conditions, and the thicknesses of the second and third films formed on the piezoelectric substrate are measured using a fluorescent X-ray analyzer. Thus, the thicknesses of second metal film 5 and third metal film 6 on piezoelectric substrate 1 can be obtained.

In this method of measuring the thickness, the thicknesses of a plurality of kinds of metal films are measured during a manufacturing process. Thus, the thicknesses of the metal films can be controlled accurately. This can improve the target property of an electronic component with respect to high frequency, e.g. reduce deviation from a target frequency and variations in frequency.

Second Exemplary Embodiment

A manufacturing method in accordance with a second exemplary embodiment is described with reference to FIGS. 2A through 2E. Components similar to those described in the first exemplary embodiment are denoted with the same reference marks, and the descriptions of those components are omitted.

Figure 2A:
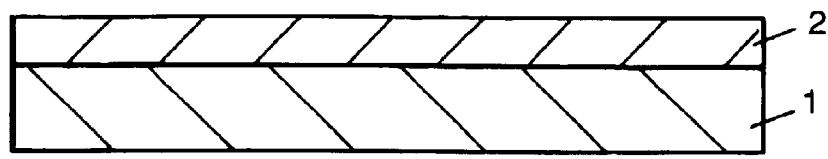
FIGS. 2A through 2E are sectional views of a SAW filter in accordance with a second exemplary embodiment of the present invention, showing a manufacturing process thereof.
Figure 2B:
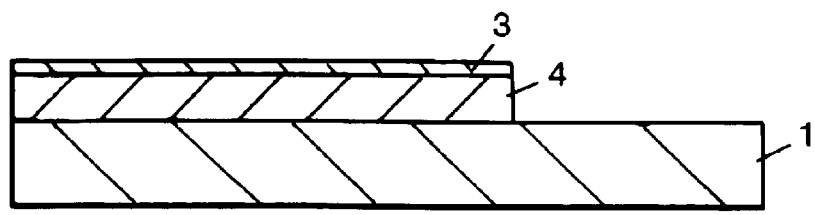
Figure 2C:
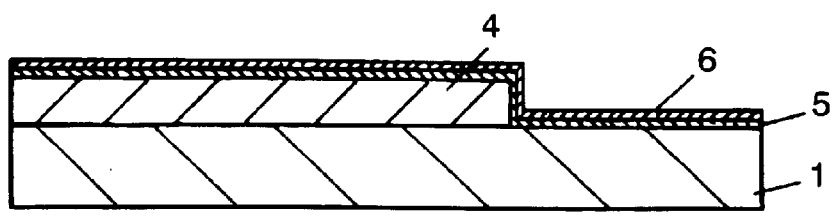

The steps shown in FIG. 2A through 2C are similar to those shown in FIGS. 1A through 1C. In the steps shown in FIGS. 2A through 2C, bottom part 4 of a first conductive pattern is formed on piezoelectric substrate 1, and second metal film 5 and third metal film 6 are formed on the side of the piezoelectric substrate having the bottom part.

Figure 2D:
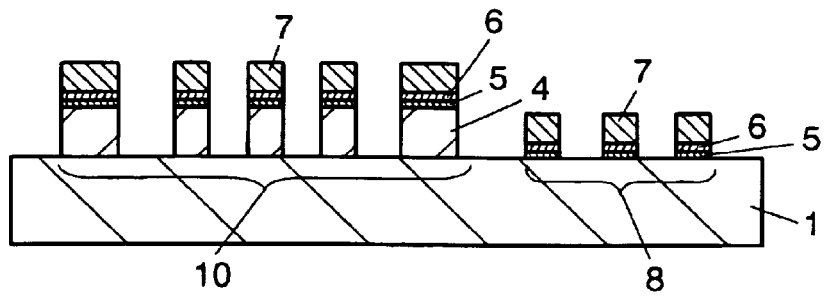

Next, photo-resist layer 7 is applied to third metal film 6. Desired patterns are exposed to light and developed by photo-lithography. Thereafter, third metal film 6, second metal film 5, and bottom part 4 of the first conductive pattern are dry-etched to form first conductive pattern 10 and second conductive pattern 8 at the same time, as shown in FIG. 2D.

Figure 2E:
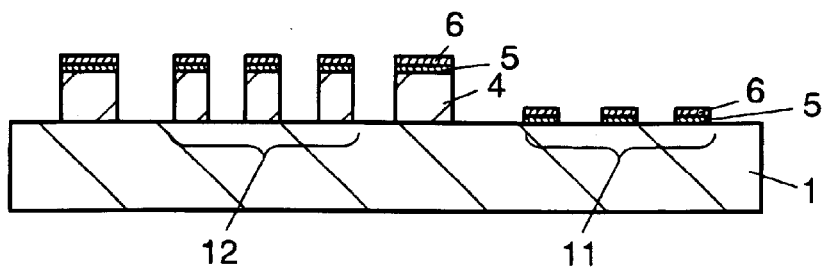

Next, as shown in FIG. 2E, photo-resist layer 7 is peeled off to form low-frequency surface acoustic wave (SAW) filter 12 made of first conductive pattern 10 and high-frequency SAW filter 11 made of second conductive pattern 8, at the same time.

Thus, two kinds of SAW devices having metal films of different thicknesses are formed on one piezoelectric substrate 1 at the same time. Forming metal films having different thicknesses on one piezoelectric substrate by combination of formation of a plurality of metal films and etching reduces deviation from a target frequency and variations in frequency in a plurality of SAW devices accommodating to various frequencies. Thereafter, the plurality of devices is cut into a predetermined dimension to provide respective pieces of SAW devices.

When a thick metal film and a thin metal film are etched independently, the etching process must be performed at least twice. However, the optimum etching conditions vary with the thickness of the metal film. For this reason, the metal film and piezoelectric substrate are considerably influenced by etching. This increases deviation from a target frequency and variations in frequency in some cases.

For the present invention, to avoid the above problems, a thick metal film and a thin metal film are etched at the same time, and reduction in the number of etching processes reduces the influence of etching, and thus deviation from a target frequency and variations in frequency.

The influence of etching is specifically described hereinafter. During etching, the properties may vary even under the etching conditions of set values. This is because every etching process is influenced by circumstance conditions and thus some etching processes are excessive over the set values and the other etching processes are insufficient. In every etching process, the influence subtly changes. For this reason, when etching processes are performed a plurality of times, the first etching process is excessive and the second etching process is insufficient, for example. In this case, the influence of the etching processes on the metal films and a piezoelectric substrate are so complicated that a simple correction cannot be made.

However, when the etching process is performed only once, the influence thereof can easily be corrected.

Thus, reducing the number of etching processes can control a plurality of metal films having different thicknesses accurately, and reduce deviation from a target frequency and variations in frequency. Such an effect is more obvious when a plurality of metal films having similar thicknesses is formed because metal films having similar thicknesses are significantly influenced by etching.

Additionally, reducing the number of etching processes reduces the number of heat treatment after application of a photo-resist layer. This reduces generation of static electricity, electrostatic discharge damage, or the like caused by the heat treatment. Thus, the yield and reliability of the devices can be improved.

Further, reducing the number of etching processes can reduce the number of man-hour and plant investment, thus allowing cost reduction.

Third Exemplary Embodiment

A manufacturing method in accordance with a third exemplary embodiment is described with reference to FIGS. 3A through 3H. Components similar to those described in the first exemplary embodiment are denoted with the same reference marks, and the descriptions of those components are omitted.

The steps shown in FIGS. 3A through 3F are similar to those shown in FIGS. 1A through 1F. Second conductive pattern 14 and first conductive pattern 13 are formed on piezoelectric substrate 1. However, in this structure, a part of the second conductive pattern is connected to a part of the first conductive pattern.

Figure 3A:
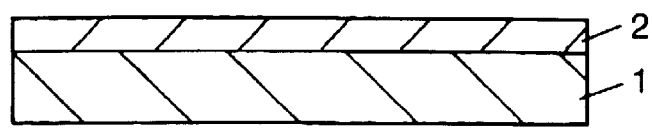
FIGS. 3A through 3H are sectional views of a SAW filter in accordance with a third exemplary embodiment of the present invention, showing a manufacturing process thereof.
Figure 3B:
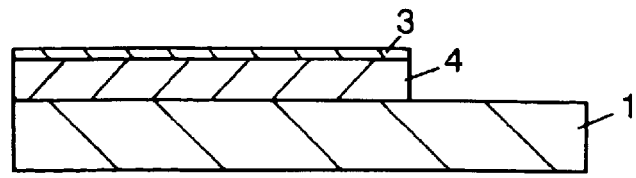
Figure 3C:
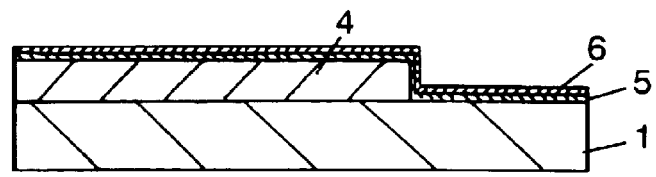
Figure 3D:
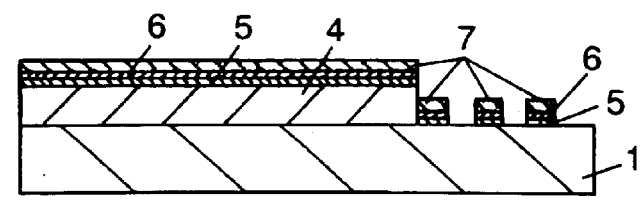
Figure 3E:
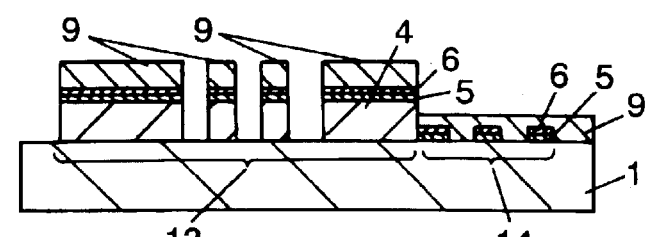
Figure 3F:
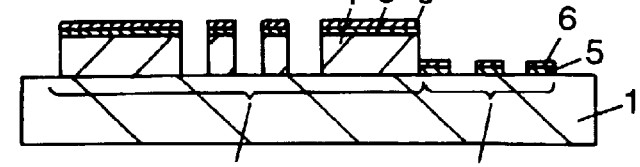
Figure 3G:
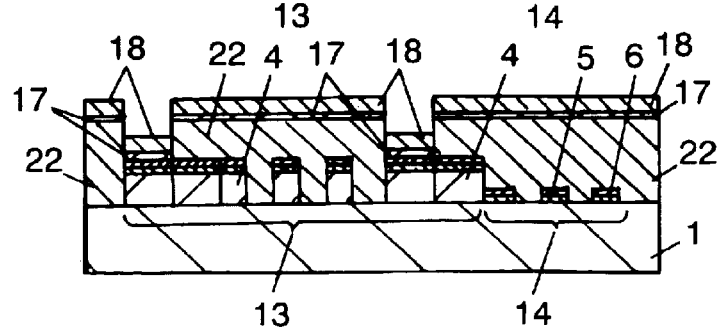
Figure 3H:
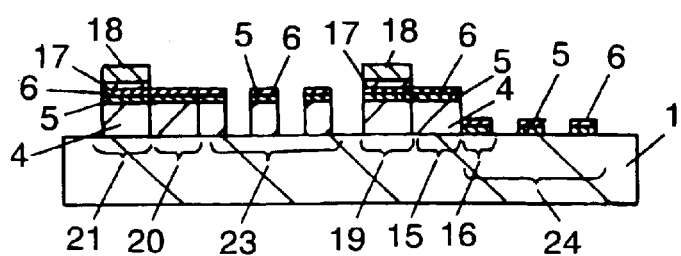

Next, photo-resist layer 22 is applied to the entire surface. While second conductive pattern 14 and the part except pad electrodes 19 and 21 in first conductive pattern 13 are protected, desired patterns are exposed to light and developed by photolithography. Further, fourth metal film 17, e.g. a 100-nm-thick Ti-containing layer, is formed on the photo-resist layer by vapor deposition. As shown in FIG. 3G, fifth metal film 18, e.g. a 300-nm-thick Al-containing layer, is formed on the fourth metal film. Thereafter, as shown in FIG. 3H, photo-resist layer 22 and the fourth metal film and the fifth meal film formed on photo-resist layer 22 are removed by lift-off to form fourth metal film 17 and fifth metal film 18 on first conductive pattern 13. Next, the patterns are cut into a predetermined dimension to provide pieces of surface acoustic wave (SAW) devices. Thereafter, a piece of SAW devices obtained in this manner is disposed on the bottom of a package or the like, and a pad electrode and a terminal electrode connection on the package are connected via a bonding wire, bump, and the like. Then, the package is sealed to provide an electronic component.

In the first exemplary embodiment, first conductive pattern 10 is structured so that the first, second, and third metal films are laminated and second conductive pattern 8 is structured so that the second and third metal films are laminated. The first and second conductive patterns are independently formed.

On the other hand, the third exemplary embodiment includes:

1) lead electrode 15, a part of first conductive pattern 13, connected to second conductive pattern 14;

2) pattern 16, a part of second conductive pattern 14, connected to first conductive pattern 13; and 3) pad electrode 19 connected to lead electrode 15 and made of a part of first conductive pattern 13. In pad electrode 19, fourth metal film 17 is formed on third metal film 6, and fifth metal film 18 is further formed on the fourth metal film.

The third exemplary embodiment further includes:

4) lead electrode 20 made of a part of first conductive pattern 13; and 5) pad electrode 21 connected to lead electrode 20 and made of a part of first conductive pattern 13. In pad electrode 21, fourth metal film 17 is formed on third metal film 6, and fifth metal film 18 is further formed on the fourth metal film.

In production of such an electronic component, a piece of SAW devices can be mounted on a mounting substrate of the same shape and dimension as the piece via a bump or conductive paste to provide a chip size package (CSP).

Shown in the third exemplary embodiment is a structure in which fourth metal film 17 and fifth metal film 18 are formed on first conductive pattern 13 to provide lead electrode 20 and pad electrode 21. Besides this structure, the fourth metal film and fifth metal film are provided on second conductive pattern 14 and the lead electrode or pad electrode is provided on second conductive pattern 14.

As described above, in the third exemplary embodiment, lead electrode 20 and pad electrode 21 are provided to connect with first SAW device 23 and lead electrode 15 and pad electrode 19 are provided to connect with second SAW device 24. This structure thickens not only first SAW device 23 but also lead electrode 15 of thin second SAW device 24. This reduces connection impedance with respect to an external connection terminal and thus a loss in the SAW devices. As obvious from FIG. 3H, lead electrode 15 includes neither fourth metal film 17 nor fifth meal film 18. However, lead electrode 15 is thick even without the step of providing fourth metal film 17 and fifth metal film 18.

Providing fifth metal film 18 in pad electrode 19 and pad electrode 21 via fourth metal film 17 increases the bonding strength and electric strength of the electrodes.

Fourth metal film 17 not only improves adhesion of a plurality of laminated metal films but also prevents a decrease in the bonding strength of the electrode when an external connection terminal is connected onto fifth meal film 18. For example, when an Au bump is provided on fifth metal film 18 for connection with an external connection terminal, Au in the Au bump has properties of diffusing in fifth metal film 18 and deteriorating the bonding strength of the electrode. Fourth metal film 17 prevents diffusion of Au and increases the bonding strength of the electrode, thus preventing peeling of the electrode at bonding.

As described above, the materials of second metal film 5 and fourth metal film 17 are similar to each other; however, the purpose of providing them is obviously different. The two metal films have respective advantages of their own.

Additionally, forming fifth metal film 18 by vapor deposition can provide a soft metal film on the uppermost layer. This soft metal film increases the bonding strength with respect to an external connection terminal, e.g. a bonding wire and a bump, and reduces contact resistance. This can reduce a loss in a SAW device, and improve the bonding reliability and life thereof.

In the above description, the fourth and fifth metal films are formed after the production of the first and second conductive patterns in accordance with the first exemplary embodiment. However, the same advantage can be obtained by the method described in the second exemplary embodiment instead of the first exemplary embodiment.

INDUSTRIAL APPLICABILITY

As described above, in accordance with the present invention, surface acoustic wave (SAW) devices having different thicknesses are formed on one piezoelectric substrate so that a thinner SAW device is formed first or both SAW devices are formed at the same time. Metal films are formed by sputtering. First, the bottom part of a first conductive pattern is formed by etching. Next, the other conductive patterns are formed by etching. This method allows accurate formation of the conductive patterns. This can reduce deviation from a target frequency and variations in frequency and especially realize a high-frequency SAW filter of higher performance. Additionally, the device is structured to have a thick lead electrode and a thick pad electrode. This structure can increase the bonding strength with respect to an external connection terminal, and reduce contact resistance. This can reduce a loss in the SAW device, and increase the bonding reliability and life thereof.

What is claimed is:

1. A method of manufacturing a surface acoustic wave (SAW) device comprising steps of:

forming a first metal film on a piezoelectric substrate;

forming a bottom part of a first conductive pattern by etching the first metal film;

forming a second metal film on a side of the piezoelectric substrate having the bottom part of the first conductive pattern;

forming a third metal film on the second metal film; and forming the first conductive pattern and a second conductive pattern by etching the first metal film, the second metal film and the third metal film.

2. The method of manufacturing a SAW device of claim 1, wherein said step of forming the first conductive pattern and the second conductive pattern comprise the sub-steps of:

forming the second conductive pattern by etching the second metal film and the third metal film existing in an area other than an area having the bottom part of the first conductive pattern; and forming the first conductive pattern by etching the third metal film, the second metal film and the first metal film in the area having the bottom part of the first conductive pattern.

3. The method of manufacturing a SAW device of claim 1, wherein the second conductive pattern is formed before the first conductive pattern.

4. The method of manufacturing a SAW device of claim 1, wherein the first conductive pattern and the second conductive pattern are formed at the same time in said step of forming the first conductive pattern and the second conductive pattern.

5. The method of manufacturing a SAW device of claim 1, wherein the first conductive pattern is formed thicker than the second conductive pattern.

6. The method of manufacturing a SAW device of claim 1, wherein at least one of the first metal film, the second metal film, and the third metal film is formed by sputtering.

7. The method of manufacturing a SAW device of claim 1, wherein the bottom part of the first conductive pattern is formed by wet etching.

8. The method of manufacturing a SAW device of claim 1, wherein at least one of the first conductive pattern and the second conductive pattern is formed by dry etching.

9. The method of manufacturing a SAW device of claim 1, wherein the first metal film contains at least Al as a component thereof.

10. The method of manufacturing a SAW device of claim 1, wherein the second metal film is made of a metal material highly adherent to the first metal film.

11. The method of manufacturing a SAW device of claim 1, wherein the second metal film contains at least one of Ti, Cr, Ta, W, Ni, Mo, and Mg, as a component thereof.

12. The method of manufacturing a SAW device of claim 1, wherein the third metal film contains at least Al as a component thereof.

13. The method of manufacturing a SAW device of claim 1, further comprising a step of providing a protective film on at least a part of at least one of the first conductive pattern and the second conductive pattern.

14. The method of manufacturing a SAW device of claim 1, wherein a thickness ratio of the first conductive pattern and the second conductive pattern with respect to a thinner pattern is at least two.

15. The method of manufacturing a SAW device of claim 1, wherein a center frequency of the SAW device formed of at least one of the first conductive pattern and the second conductive pattern is at least 1 GHz.

16. The method of manufacturing a SAW device of claim 1, further comprising steps of:
    forming a fourth metal film on at least one of the first conductive pattern and the second conductive pattern;
    forming a fifth metal film on the fourth metal film; and
    forming a pattern in the fifth metal film and the fourth metal film.

17. The method of manufacturing a SAW device of claim 16, wherein at least one of the fourth metal film and the fifth meal film is formed by vapor deposition.

18. The method of manufacturing a SAW device of claim 16, wherein said step of forming a pattern in the fifth metal film and the fourth metal film includes a sub-step of lifting off a photo-resist layer and the fourth metal film and the fifth metal film formed on the photo-resist layer.

19. The method of manufacturing a SAW device of claim 1, wherein a part of the first conductive pattern is coupled to a part of the second conductive pattern.

20. The method of manufacturing a SAW device of claim 19, wherein the part of the first conductive pattern coupled to the part of the second conductive pattern is one of a lead electrode and a pad electrode for connection to an external terminal.

21. The method of manufacturing a SAW device of claim 16, wherein a part of one of the first conductive pattern and the second conductive pattern having the fourth metal film and the fifth metal film formed thereon is one of a lead electrode and a pad electrode for connection to an external terminal.

22. The method of manufacturing a SAW device of claim 16, wherein the fourth metal film is made of a material for inhibiting diffusion of a metal that forms an external terminal coupled to the fifth metal film.

23. The method of manufacturing a SAW device of claim 16, wherein the fourth metal film contains at least one of Ti, Cr, Ta, W, Ni, Mo, and Mg, as a component thereof.

24. The method of manufacturing a SAW device of claim 16, wherein the fifth metal film contains at least Al as a component thereof.

25. The method of manufacturing a SAW device of claim 1, further comprising steps of:
    forming an area without the first metal film in said step of forming the bottom part of the first conductive pattern;
    measuring a thickness of the first metal film after said step of forming the first metal film; and
    measuring a thickness of a metal film in the area without the first metal film after said step of forming the second metal film.

26. The method of manufacturing a SAW device of claim 25, wherein said step of measuring the thickness of the metal film in the area without the first meal film is performed immediately after at least one of said steps of forming the second metal film and forming the third metal film.

27. The method of manufacturing a SAW device of claim 25, wherein the area without the first metal film is provided in a center of the piezoelectric substrate.

28. The method of manufacturing a SAW device of claim 25, wherein the area without the first metal film is provided in a plurality positions on the piezoelectric substrate.

* * * * *